United States Patent
Preuss et al.

(10) Patent No.: US 6,703,184 B1
(45) Date of Patent: Mar. 9, 2004

(54) LOW MOISTURE DONOR SUBSTRATE COATABLE WITH ORGANIC LAYERS TRANSFERRABLE IN RESPONSE IN INCIDENT RADIATION

(75) Inventors: Donald R. Preuss, Rochester, NY (US); Jehuda Greener, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/443,188

(22) Filed: May 22, 2003

(51) Int. Cl.[7] .............. G03F 7/34; G03F 7/11; G03F 7/09
(52) U.S. Cl. ............ 430/276.1; 430/200; 430/201; 430/271.1
(58) Field of Search ................ 430/200, 201, 430/271.1, 276.1

(56) References Cited

U.S. PATENT DOCUMENTS

| | | |
|---|---|---|
| 5,538,841 A | 7/1996 | Grace et al. |
| 5,688,551 A | 11/1997 | Littman et al. |
| 5,851,709 A | 12/1998 | Grande et al. |
| 6,114,088 A | 9/2000 | Wolk et al. |
| 6,140,009 A | 10/2000 | Wolk et al. |
| 6,214,520 B1 | 4/2001 | Wolk et al. |
| 6,221,553 B1 | 4/2001 | Wolk et al. |
| 6,566,032 B1 * | 5/2003 | Boroson et al. ............ 430/200 |

* cited by examiner

Primary Examiner—Richard L. Schilling
(74) Attorney, Agent, or Firm—Raymond L. Owens

(57) ABSTRACT

A low moisture donor element for use in transferring moisture sensitive organic material to an OLED device including a low moisture transparent support; an optional absorber antireflecting layer which increases the absorption efficiency of the element; a metallic heat absorbing layer provided over the low moisture transparent support; and an organic transfer layer consisting of one or more heat transferable organic layers provided over the support.

7 Claims, 2 Drawing Sheets

LOW MOISTURE DONOR SUBSTRATE COATABLE WITH ORGANIC LAYERS TRANSFERRABLE IN RESPONSE IN INCIDENT RADIATION

CROSS REFERENCE TO RELATED APPLICATION

Reference is made to commonly assigned U.S. patent application Ser. No. 10/393,033 filed Mar. 20, 2003, entitled "A High Absorption Donor Substrate Coatable With Organic Layer(s) Transferrable In Response To Incident Laser Light" by Donald R. Preuss et al, the disclosure of which is incorporated herein by reference.

FIELD OF THE INVENTION

The present invention relates to thermal transfer of organic materials from a donor element to a receiving device such as an OLED device.

BACKGROUND OF THE INVENTION

In color or full-color organic electroluminescent (EL) displays (also known as organic light-emitting diode devices, or OLED devices) having an array of colored pixels such as red, green, and blue color pixels (commonly referred to as RGB pixels), precision patterning of the color-producing organic EL media are required to produce the RGB pixels. The basic OLED device has in common an anode, a cathode, and an organic EL medium sandwiched between the anode and the cathode. The organic EL medium can consist of one or more layers of organic thin films, where one of the layers is primarily responsible for light generation or electroluminescence. This particular layer is generally referred to as the emissive layer of the organic EL medium. Other organic layers present in the organic EL medium can provide electronic transport functions primarily and are referred to as either the hole transport layer (for hole transport) or electron transport layer (for electron transport). In forming the RGB pixels in a full-color OLED display panel, it is necessary to devise a method to precisely pattern the emissive layer of the organic EL medium or the entire organic EL medium.

A suitable method for patterning high-resolution OLED displays has been disclosed in U.S. Pat. No. 5,851,709 by Grande et al. this method is comprised of the following sequences of steps: 1) providing a substrate having opposing first and second surfaces; 2) forming a light-transmissive heat-insulating layer over the first surface of the substrate; 3) forming a light-absorbing layer over the heat-insulating layer; 4) providing the substrate with an array of openings extending from the second surface to the heat-insulating layer; 5) providing a transferable color-forming organic donor layer formed on the light-absorbing layer; 6) precision aligning the donor substrate with the display substrate in an oriented relationship between the openings in the substrate and the corresponding color pixels on the device; and 7) employing a source of radiation for producing sufficient heat at the light-absorbing layer over the openings to cause the transfer of the organic layer on the donor substrate to the display substrate. A problem with the Grande et al. approach is that patterning of an array of openings on the donor substrate is required. Another problem is that the requirement for precision mechanical alignment between the donor substrate and the display substrate. A further problem is that the donor pattern is fixed and cannot be changed readily. Littman and Tang (commonly-assigned U.S. Pat. No. 5,688,551) teach the patternwise transfer of organic EL material from an unpatterned donor sheet to an EL substrate. A series of patents by Wolk et al (U.S. Pat. Nos. 6,114,088; 6,140,009; 6,214,520; and 6,221,553) teaches a method that can transfer the luminescent layer of an EL device from a donor element to a substrate by heating selected portions of the donor with a laser beam. Each layer is an operational or non-operational layer that is utilized in the function of the device.

In these processes a donor containing the electroluminescent materials is heated by radiation and transferred to a receiver which may already contain a portion of the active device. The device may then be finished by the application of further layers. This process allows the patterning of colors by the use of a suitable donor which contains an electron or hole conductors host and a dopant. The final light emitting device must have the dopant mixed together to give a good emission. It is difficult to co-evaporate two or more materials simultaneously and maintain a constant controlled ratio. The resulting emission from these radiation-transferred devices also have need for improved efficiency.

It is well known to those skilled in the field of OLED device fabrication, that control of moisture is critical in order to obtain devices of high quality, efficiency, and stability. Most materials which are thermally suitable for use as supports for donor elements will come to equilibrium with 0.1% to 1.0% of water by weight at room temperature in the presence of 100% relative humidity, or when immersed in water. The presence of this moisture in the support material can lead to inferior OLED devices if it is not meticulously controlled. The presence of this water in the donor element can compromise the coating of metallic absorbing layers onto the support, the coating of organic transfer layers onto the support, and the transfer of organic transfer layers onto the OLED device.

SUMMARY OF THE INVENTION

It is therefore an object of the present invention to reduce the adverse effects of moisture inherent to laser transfer donor elements which are moisture sensitive, such as those used in the fabrication of OLED devices. This object is achieved by providing a low moisture donor element for use in transferring moisture sensitive organic material to an OLED device, comprising:

(a) a low moisture transparent support;

(b) an optional absorber antireflecting layer which increases the absorption efficiency of the element;

(c) a metallic heat absorbing layer provided over the low moisture transparent support; and (d) an organic transfer layer consisting of one or more heat transferable organic layers provided over the support.

Failure to remove moisture from the transparent support material results in a greater tendency for the laser exposure to ablate the absorber material, thereby contaminating the OLED device. Furthermore, moisture escaping from the transparent support during the organic coating step is very likely to result in degradation of the organic layers. The delay required to allow the moisture to be removed by exposure to vacuum in the actual organic coating station is unacceptable to a production environment, and there is no assurance that adequate moisture has been removed. It is also likely that even if ablation is avoided during the laser writing step, that the moisture released when the support is heated by the laser could adversely impact the OLED device.

Use of the transparent supports which can absorb moisture requires costly handling, and accidental exposure to moisture could go undetected until inferior OLED product is fabricated. Also, as a product, these handling restrictions could be a great inconvenience to the customer. The low moisture transparent supports do not suffer from complicated handling and storage requirements, but adhesion problems could limit the operating space for use product made from these materials.

DETAILED DESCRIPTION OF THE INVENTION

Figure 1:
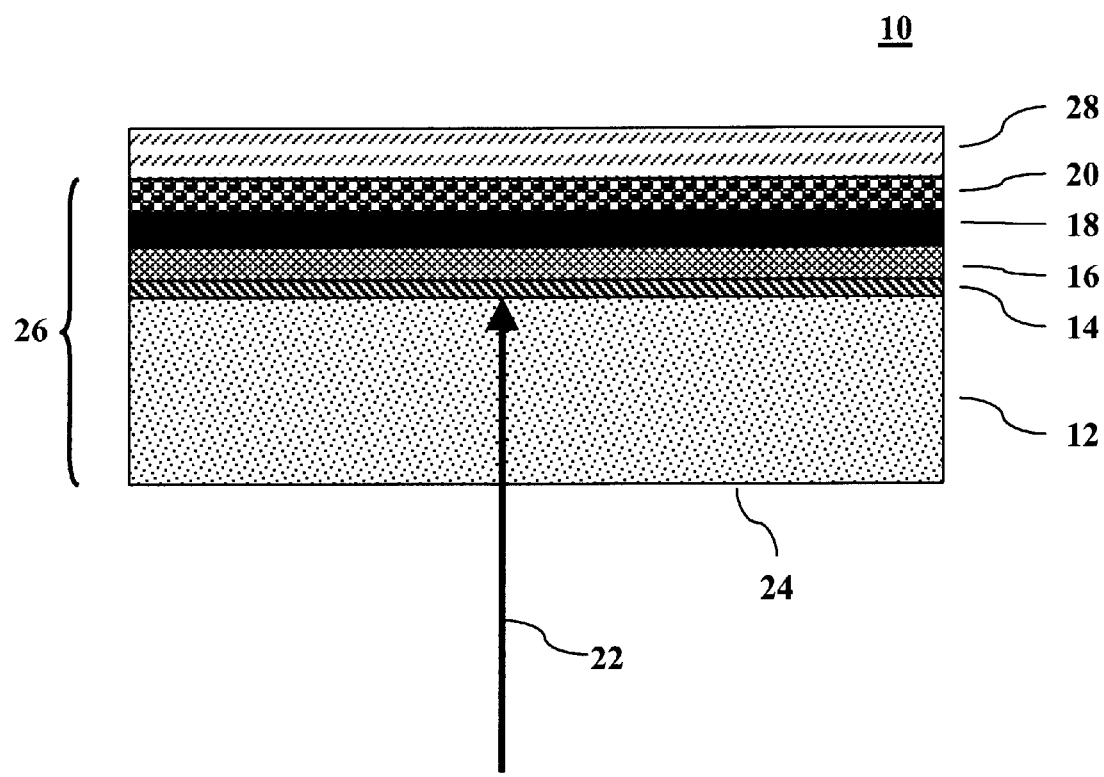
FIG. 1 is a cross-sectional representation of a low moisture donor substrate.

The invention has been described in detail with particular reference to certain preferred embodiments thereof, but it will be understood that variations and modifications can be effected within the spirit and scope of the invention. Turning now to FIG. 1, the low moisture donor element 10 consists of a low moisture transparent support 12 onto which an optional adhesive layer or surface treatment 14 is applied. An optional absorber antireflection layer 16 is then applied followed by a metallic heat absorbing layer 18. An optional isolation layer 20 may be used to insure that an organic transfer layer 28 and metallic heat absorbing layer 18 do not interact. The element described thus far will be referred to as a low moisture donor substrate 26. The organic transfer layer 28 consisting of one or more organic materials which are to be transferred to a device such as an OLED in response to laser or other radiation 22 incident on the uncoated side 24 of the low moisture donor element 10.

Many handbooks, and manufacturers data sheets report water absorption values for various polymer resins. They frequently refer to ASTM test method D570 (published by ASTM international) in which a disc of molded plastic 50.4 mm in diameter and 3.2 mm thick is dried and weighed, then immersed in water at 23° C. for 24 hours, and reweighed, noting the percentage increase in weight. 24 hours is generally not sufficient time for the plastic to come into equilibrium, so occasionally, a saturated value is also provided for the water uptake, which may require many weeks to achieve. Table 1 is a sampling of reported values by a variety of manufacturers for polymers available as thin films. This data was obtained from a variety of web sites, and is always accompanied by the disclaimer that it is believed to be reliable.

TABLE 1

| | Properties at 25° C. | | |
|---|---|---|---|
| Polymer | 24 hour % uptake | Saturated % uptake | Permeability X$10^{-13}$ cm$^2$s$^{-1}$Pa$^{-1}$ |
| Cellulose Acetate | 1.9–7.0 | | 4130–5500 |
| Fluorinated Ethylene Propylene Copolymer | 0.01 | | 13 |
| Polyamide - Nylon 6 | 2.7 | >8 | 0.14 |
| Polyamide - Nylon 6,6 | 2.3 | 8 | |
| Polyamide - Nylon 12 | | 1.6 | |
| Polybutylene terephthalate (PBT) | 0.1 | | |
| Polycarbonate (PC) | 0.1 | 0.35 | 1050 |
| Polyetheretherketone (PEEK) | 0.1–0.3 | 0.5 | 160–300 |

TABLE 1-continued

| | Properties at 25° C. | | |
|---|---|---|---|
| Polymer | 24 hour % uptake | Saturated % uptake | Permeability X$10^{-13}$ cm$^2$s$^{-1}$Pa$^{-1}$ |
| Polyetherimide (PEI) | 0.25 | 1.3 | 1 |
| Polyethersulfone (PES) | 0.4–1.0 | 2.2 | 75 |
| Polyethylene - high density (HDPE) | <0.01 | | 9 |
| Polyethylene - Low density (LDPE) | <0.015 | | 68 |
| Polyethylene terephthalate (PET) | 0.1 | <0.7 | 100–115 |
| Polyimide (PI) | 0.2–2.9 | | 430 |
| Polymethylmethacrylate (PMMA) | 0.2 | | 480 |
| Polymethylpentene (TPX ®) | 0.01 | | 40 |
| Polypropylene (PP) | | 0.03 | 16 |
| Polystyrene (PS) | <0.4 | | 900 |
| Polytetrafluoroethylene (PTFE) | 0.01 | | |
| Polyvinylchloride - unplasticized (UPVC) | 0.03–0.4 | | 206 |
| Polyvinylfluoride (PVF) | 0.05 | | 10 |
| Polyvinylidenechloride (PVDC) | 0.1 | | 7 |
| Polyvinylidenefluoride (PVDF) | 0.01/0.04 | | |
| Cyclic olefin copolymer (Topas ® 6017) | | <0.01 | |

Another frequently reported value is the water permeability of a polymer, which is equal to the product of the water content, and the diffusion constant for water in the polymer. These values vary widely, and can be very temperature dependant. They are relevant because they indicate how quickly a polymer will release the absorbed water when placed in a dry environment. However, for this application, we are primarily concerned with the water absorption of the polymer.

The term "low moisture transparent support" will be defined as a support material for which the 24 hour uptake of water or the saturated uptake of water is less than 0.05% by weight as described in ASTM D570 test procedure at 25° C. The term "transparent" implies that a majority of the radiation incident on the support is transmitted to the antireflection layer and metallic heat absorbing layer, as opposed to being absorbed by the low moisture transparent support.

Most of the materials commonly considered as desirable candidates for laser transfer have high water absorption. Materials such as PEEK, polyetherimide, polyethersulfone, polysulfone, polyethylene terephthalate, and polyimide. Certain classes of polymers can generally qualify as low moisture transparent supports. They include polyolefins, fluorinate hydrocarbons, and partially fluorinated hydrocarbons. Examples of polyolefins include polyethylene, polypropylene, polymethylpentene, cyclo-olefin polymer (e.g. Zeonor®) and cyclo-olefin copolymer(e.g. Topas®). Examples of fluorinated and partially fluorinated hydrocarbons include polyvinylidenefluoride and polytetrafluoroethylene.

Some of the low moisture transparent supports may not have adequate adhesion to the antireflection layer, or metallic heat absorbing layer, and may need a surface modification such as corona discharge, or plasma exposure to improve this characteristic. The classic example would be PTFE, more commonly known as Teflon®. In order to function as a low moisture donor element for laser transfer, it may be necessary to apply an adhesive layer to the low moisture transparent support before coating the optional absorber antireflection layer and metallic heat absorbing layer.

The use of a plasma surface treatment (PST) to improve adhesion of materials including metals to plastics containing polyolefins is known, and taught by U.S. Pat. No. 5,538,841 and references therein. Other surface treatment techniques such as corona discharge treatment (CDT) are also known for modifying surface chemistry to improve adhesion. These treatment methods can be used in some circumstances to improve the adhesion of the absorber antireflection layer, or the metallic heat absorbing layer to the low moisture transparent support, and although the treatment has no real physical extent (thickness), it is represented in FIG. 1 as the optional adhesive layer or surface treatment 14. The optional adhesive layer or surface treatment 14 could also consist of a thin film of a material such as chromium, silver, or a dielectric which is capable of adhering to the low moisture transparent support 12 or to the low moisture transparent support which has undergone one of the aforementioned surface treatments such as CDT or PST.

In addition to selecting a low moisture transparent support from which to fabricate a low moisture donor substrate, there are other steps one may take to further improve the very low moisture environment required for the thermal transfer of moisture sensitive organic materials. These include:

1. Vacuum exposure of the low moisture transparent support or the low moisture donor substrate for a period of time in excess of 10 minutes, governed by the thickness and diffusion coefficient of the material. Single sheets can be effectively vacuum desiccated in 10 to 100 minutes, but stacked sheets, or full rolls may take longer than a year, as the drying time will vary with the square of the material or roll thickness. This process by itself has merit in research applications where throughput is not an issue, but it is costly in a manufacturing environment.

2. Baking of the low moisture transparent support, or the low moisture donor substrate in a dry or vacuum environment; Diffusion rates in polymers are very temperature dependent. Heating a polymer not only forces a greater fraction of the water out of the material by lowering the RH of the immediate environment, but it also increases the rate at which the process occurs. Baking is an important step in fabricating a donor element for transfer of moisture sensitive organic materials. It does, however, add to the complexity and cost of a manufacturing process, so it is quite important that the transparent support be a low moisture transparent support in order to minimize the time and equipment required for effective baking.

3. Never allow the low moisture transparent support to absorb moisture in the first place; It is easy for moisture to get into a material, and difficult to remove it. A viable strategy is to keep the low moisture transparent support dry from the day it is made. Thermoplastics are extruded from a molten resin to form thin supports. This process occurs at a high temperature, characteristic of the particular polymer resin being extruded. At the time of extrusion, the polymer has been dried and heated, and is likely to contain only a small fraction of the water that it can hold at room temperature. A large roll of freshly extruded support can be kept in a low RH environment by a combination of the use of a desiccant and the use of packaging which is resistant to the transport of water. Couple this with the low moisture absorption property of a low moisture transparent support, and an extremely favorable environment for the thermal transfer of moisture sensitive organic materials can be created.

Figure 2:
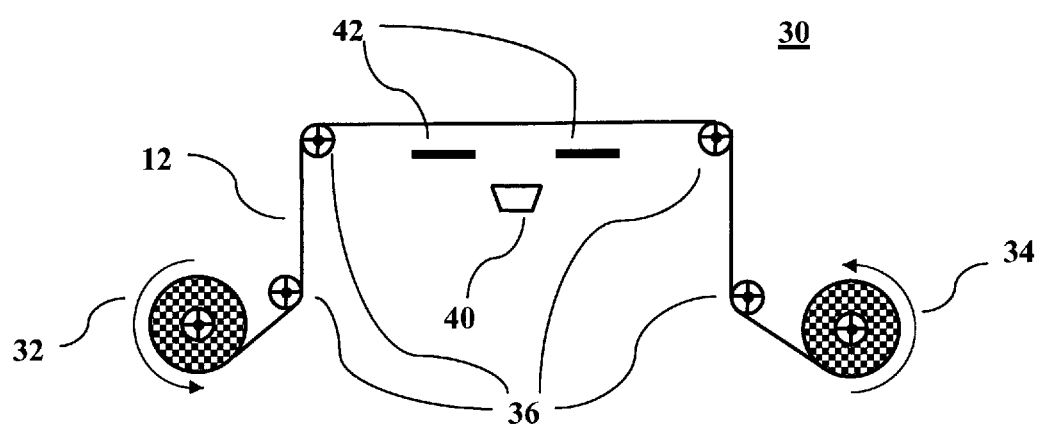
FIG. 2 is a representation of a web transport mechanism for vacuum coating the heat absorption layers of a low moisture donor element.

Turning now to FIG. 2, it is practical to coat the optional adhesive layer or surface treatment 14, the optional absorber antireflection layer 16 and the metallic heat absorbing layer 18 in a vacuum roll coating device 30. A length of low moisture transparent support 12 is wound onto a core, and placed onto the feed roller 32, threaded across idle rollers 36), and fastened to a core the take up roller 34. Deposition source 40 is supplied with the material to be coated. It can be a sputter source, e-beam source, or a thermal evaporation source. An aperture 42 is used to limit the area being coated.

EXAMPLE 1

A preferred embodiment of a low moisture donor was prepared by using 3 mil thick Kynar® support (Westlake Plastics Company) which is an extrusion of PVDF resin. PVDF is, by our definition, a low moisture transparent support. A roll of PVDF approximately 10 meters long was wound onto an aluminum core, and placed on the feed roller of the web transport represented in FIG. 2. The entire transport was situated in a bell jar vacuum coater. The coater was evacuated to its base pressure of $8 \times 10^{-7}$ Torr. After about 1 hour in vacuum, there was no apparent pressure increase as the support was transported between feed roller and the take up roller, indicating that an insignificant moisture was evolving from the inner turns of the roll as they were freshly exposed to vacuum. This was in sharp contrast to the behavior with typical higher moisture transparent supports such as polysulfone, polyimide, PET or PEN. When rolls of higher moisture transparent support were installed in the vacuum coater, the background pressure would rise above $10^{-5}$ Torr whenever the web was transported. This problem was accommodated by baking the roll of support in vacuum, at 80° C. for 4 days (PET, PEN) or at 120° C. for 1 day (polysulfone, polyimide)

A layer of silicon, approximately 40 nm thick was coated by dc magnetron sputtering in a background gas of 6 m Torr of Argon, as the Kynar web was transported past the aperture. The silicon layer served as the optional absorber antireflection layer 16 The web was re-wound onto the feed spool, and the system was vented with dry nitrogen. The silicon source was quickly replaced with a chromium source, and the vacuum chamber was re-evacuated to $10^{-6}$ Torr. A layer of chromium, approximately 40 nm thick was coated onto the silicon layer by dc magnetron sputtering in a background gas of 3 m Torr of argon, as the Kynar web with silicon was transported past the aperture. The chromium layer served as the metallic heat absorbing layer 18. The low moisture donor substrate (Kynar with silicon and chromium layers) was cut into sheets, and stored in a laboratory environment (typically 22° C. and 30% RH). Based on the properties of Kynar, one would expect the support to equilibrate with about 0.003% to 0.012% water.

A sheet of the low moisture donor substrate was placed in a second vacuum system. An organic transfer layer was evaporated onto the low moisture donor substrate as 20 nm of 2-tert-butyl-9,10-bis(2-naphthyl)anthracene (TBADN), followed by 0.25 nm of tetra-tert-butyl-perylene (TBP) to create a low moisture donor element 10 for an OLED process, which was capable of providing the blue emission layer for an OLED device. The organic transfer layer was transferred from the a blue low moisture donor element 10 to an in-process OLED device using a scanning infrared laser of 810 nm wavelength to heat the blue simple donor element 10. The laser spot was 0.010 mm by 2.56 mm, and had a total output power of 1.5 W. It was swept at a rate of 100 mm/s in the direction of the 0.01 mm dimension, thereby exposing the donor element to 6.1 mJ/mm$^2$ of energy in a time period of approximately 100 microseconds. This exposure was sufficient to transfer the organics from the donor sheet to the in process OLED device. Completion of the device produced a blue color element as would be expected for this chemical combination. The OLED device with and without the laser transferred layer had CIE color coordinates of CIEx=3.48; CIEy=0.528 for the control with no laser transferred material, to CIEx=0.168; CIEy=0.206 for the device described above, indicating the successful application of the blue emission layer.

The invention has been described in detail with particular reference to certain preferred embodiments thereof, but it will be understood that variations and modifications can be effected within the spirit and scope of the invention.

PARTS LIST

| | |
|---|---|
| 10 | low moisture donor element |
| 12 | low moisture transparent support |
| 14 | adhesive layer or surface treatment |
| 16 | absorber antireflection layer |
| 18 | metallic heat absorbing layer |
| 20 | optional isolation layer |
| 22 | laser or other radiation |
| 24 | uncoated side |
| 26 | low moisture donor substrate |
| 28 | organic transfer layer |
| 30 | vacuum roll coating device |
| 32 | feed roller |
| 34 | take up roller |
| 36 | idle rollers |
| 40 | deposition source |
| 42 | aperture |

What is claimed is:

1. A low moisture donor element for use in transferring moisture sensitive organic material to an OLED device, comprising:

(a) a low moisture transparent support;

(b) an absorber antireflecting layer which increases the absorption efficiency of the element;

(c) a metallic heat absorbing layer provided over the low moisture transparent support; and (d) an organic transfer layer consisting of one or more heat transferable organic layers provided over the support.

2. The donor element of claim 1 wherein the support includes a polyolefin such as polymethylpentene, polyethylene or polypropylene or a fluorinated hydrocarbon such as polyvinylidenefluoride or polytetrafluoroethylene a cyclic-olefin polymer, or a cyclic-olefin copolymer.

3. A donor element for use in transferring moisture sensitive organic material to an OLED device, comprising:

(a) a low moisture transparent support;

(b) an absorber antireflecting layer which increases the absorption efficiency of the element;

(c) a metallic heat absorbing layer provided over the low moisture transparent support; and (d) an organic transfer layer consisting of one or more heat transferable organic layers provided over the support.

4. The element of claim 3, further including an adhesive layer or surface treatment to the low moisture transparent support to facilitate adhesion.

5. The element of claim 4 wherein the adhesive layer or surface treatment includes a corona discharge treatment (CDT), or a plasma surface treatment (PST).

6. The element of claim 4 wherein the adhesive layer includes a layer of deposited metal or dielectric less than 10 nm thick.

7. The element of claim 5 wherein the adhesive layer includes a layer of deposited metal or dielectric less than 10 nm thick.

* * * * *